(12) United States Patent
Berkovich et al.

(10) Patent No.: US 11,536,571 B2
(45) Date of Patent: Dec. 27, 2022

(54) METHOD AND SYSTEM FOR MAGNETIC-BASED INDOOR VEHICLE POSITIONING

(71) Applicant: INVENSENSE, INC., San Jose, CA (US)

(72) Inventors: Gennadii Berkovich, Calgary (CA); Dmitry Churikov, Calgary (CA)

(*) Notice: Subject to any disclaimer, the term of this patent is extended or adjusted under 35 U.S.C. 154(b) by 127 days.

(21) Appl. No.: 17/082,490

(22) Filed: Oct. 28, 2020

(65) Prior Publication Data

US 2022/0128365 A1     Apr. 28, 2022

(51) Int. Cl.
| G01C 21/08 | (2006.01) |
| G01C 21/20 | (2006.01) |
| G01R 33/10 | (2006.01) |
| G01C 21/00 | (2006.01) |
| G01C 21/32 | (2006.01) |

(52) U.S. Cl.
CPC .......... *G01C 21/206* (2013.01); *G01C 21/08* (2013.01); *G01C 21/32* (2013.01); *G01C 21/3848* (2020.08); *G01R 33/10* (2013.01)

(58) Field of Classification Search
CPC .. G01C 21/206; G01C 21/3848; G01C 21/08; G01C 21/32; G01R 33/10
See application file for complete search history.

(56) References Cited

U.S. PATENT DOCUMENTS

2017/0089706 A1* 3/2017 Ribeiro .................. G01C 21/20
2021/0025710 A1* 1/2021 Dunik ................... G01C 21/165

FOREIGN PATENT DOCUMENTS

WO    WO-2020005580 A1 *  1/2020  ............. G01C 17/38

OTHER PUBLICATIONS

Ru, X.; Gu, N.; Shang, H.; Zhang, H. "MEMS Inertial Sensor Calibration Technology: Current Status and Future Trends." Micromachines 2022, 13, 879 and D. Yang, J-K. Woo, S. Lee, J. Mitchell, D. Challoner.
K. Najafi. "A Micro Oven-Control System for Inertial Sensors." Journal of Microelectromechanical Systems, vol. 26, Issue 3, Jun. 2017, p. 507-518.
"Inertial measurement unit." https://en.wikipedia.org/wiki/Inertial_measurement_unit.
"Jacobian matrix", https://en.wikipedia.org/wiki/Jacobian_matrix_and_determinant.

(Continued)

*Primary Examiner* — Vivek D Koppikar
*Assistant Examiner* — Jeffrey R Chalhoub

(57) ABSTRACT

Vehicle position is determined using magnetic field measurements within an indoor environment. Magnetic field measurements and sensor information are obtained from the vehicle and magnetic map information is obtained for the indoor environment. Parameters of vehicle motion are derived from the sensor information. The magnetic field measurements are processed to mitigate vehicular interference and then compensated for a magnetometer bias induced at least in part by the vehicle. Vehicle position is determined based at least in part on the compensated magnetic field magnetic measurements, the magnetic map information and the parameters of vehicle motion.

21 Claims, 11 Drawing Sheets

(56) References Cited

OTHER PUBLICATIONS

V. Renaudin and C. Combettes. "Magnetic, Acceleration Fields and Gyroscope Quaternion (MAGYQ)-Based Attitude Estimation with Smartphone Sensors for Indoor Pedestrian Navigation" Sensors, 2014, 14, p. 22864-22890.

Charles-Ivan Chesneau. "Magneto-Inertial Dead-Reckoning in inhomogeneous field and indoor applications." PhD theses Universite Grenoble Alpes, 2018.

Eric Dorveaux, Thomas Boudot, Mathieu Million, Nicolas Petit. "Combining Inertial Measurements and Distributed Magnetometry for Motion Estimation." 2011 American Control Conference on O'Farrell Street, San Francisco, Ca, USA. Jun. 29 -Jul. 1, 2011, pp. 4249-4256.

\* cited by examiner

METHOD AND SYSTEM FOR MAGNETIC-BASED INDOOR VEHICLE POSITIONING

FIELD OF THE PRESENT DISCLOSURE

The present disclosure relates to positioning within indoor environments. More specifically, systems and methods are provided for magnetic-based techniques that avoid the need for dedicated infrastructure.

BACKGROUND

A variety of technologies have been developed to help determine position information for moving platforms, such as autonomous or piloted vehicles. For example, the Global Navigation Satellite Systems (GNSS) comprises a group of satellites that transmit encoded signals and receivers on the ground, by means of trilateration techniques, can calculate their position using the travel time of the satellites' signals and information about the satellites' current location. GNSS is considered a reference-based technique and provides an absolute source of navigational information. The desirability of obtaining position information extends to indoor environments where multiple types of vehicles may be employed, including forklifts and other service machinery in a warehouse, automobiles and buses in underground parking structures, wheelchairs in a hospital, and mobile robots or unmanned aerial vehicles (UAV)/drones that navigate within buildings. However, GNSS is typically unsatisfactory when use for indoor positioning due to the attenuation of satellite signals in the walls and roofs buildings, necessitating use of different technologies.

In the absence of GNSS signals in indoor environments, an Inertial Navigation System (INS) may be used by employing techniques such as dead reckoning to help determine position. INS is a self-contained and/or "non-reference based" technique that utilizes inertial sensors within the moving object and do not depend upon external sources of information that can become interrupted or blocked. Motion sensors are self-contained within the moving object and measure motion, such as through the use of gyroscopes to measure the object's rate of rotation/angle and accelerometers to measure the object's specific force (from which acceleration is obtained). Using initial estimates of position, velocity and orientation angles of the moving object as a starting point, the INS readings can subsequently be integrated over time and used to determine a navigation solution. Typically, measurements are integrated (mathematical integration which is a calculus operation) once for gyroscopes to yield orientation angles and twice for accelerometers to yield position of the moving object incorporating the orientation angles. Thus, sensor measurements will undergo a triple integration operation during the process of yielding position. Integrated navigation techniques usually integrate (i.e. combine) reference-based or absolute navigational information with self-contained or non-reference based navigation information. Integrated navigation techniques may employ state estimation techniques, such as a Kalman filter, an extended Kalman filter, a particle filter, or others, which have characteristics including a prediction phase and an update phase (which may also be termed a measurement update phase). A state estimation technique also uses a system model and measurement model(s) based on what measurements are used. The system model is used in the prediction phase, and the measurement model(s) is/are used in the update phase.

Due to the integration operations (the mathematical integration as in calculus), motion sensor-based techniques may fail to provide adequate performance by themselves, particularly over longer durations due to significant performance degradation from accumulating sensor drifts and bias. As such, positioning technologies relying solely on motion sensors may not satisfy all requirements for seamless indoor navigation applications. As a result, alternative positioning techniques that can provide strong coverage in areas where access to GNSS and other reference-based positioning is degraded or denied are desirable. One class of techniques is known as "fingerprinting," and relies on recording patterns of electromagnetic signals at known locations within an area for which position information may be desired. When a device subsequently measures a pattern of received signals that is correlated with a known location, that location may be used to determine the position of the device and/or to aid another positioning technique, such as through integration with the INS techniques noted above. A suitable example of signals that may be used for fingerprinting may be based on the communication signals for an IEEE 802.11 Wireless Local Area Network (WLAN), commonly referred to as "WiFi." However, many different electromagnetic signals are suitable for location determinations using fingerprinting, including other wireless communication signals such as Bluetooth™ and radiofrequency identification (RFID). Still further, environmental signals such as magnetic fields can also provide the necessary fingerprints and benefit from the techniques of this disclosure.

Notably, magnetic-based positioning relies on variations in the Earth magnetic field created by ferrous materials of buildings construction. Magnetic-based positioning is an attractive technology of indoor positioning because it is infrastructure-free and benefits from the long-term stability of magnetic fields within buildings. Provided a suitable magnetic fingerprint map of the indoor environment is at least partly available, which is obtained by collecting magnetometer readings at positions inside a building separated by some distance, and then estimating the magnetic field in those positions by processing the magnetometer readings, real-time magnetic-based positioning can then be realized indoors by comparing a magnetometer reading obtained in unknown position with the magnetic field values of known positions. Desirably, magnetic-based indoor positioning of vehicles addresses perturbations in the ambient magnetic fields caused by the operation of the engines or motors used to power or operate the vehicles. Further, there is a need to compensate for biases in the magnetometer measurements caused by hard- and soft-iron distortions of the environment, particularly those induced by the vehicles. Moreover, it would be desirable to accommodate differences in between the height of measurements taken for constructing the fingerprint map and the height of the sensor within the vehicle and/or the height at which the vehicle is operating. Accordingly, the techniques disclosed in these materials satisfy these and other needs.

SUMMARY

As will be described in detail below, this disclosure includes a method for determining vehicle position within an indoor environment. The method may involve obtaining magnetic field measurements from the vehicle, obtaining sensor information for the vehicle, obtaining magnetic map information for the indoor environment, deriving parameters of vehicle motion from the sensor information, processing the magnetic field measurements to mitigate vehicular interference, compensating the processed magnetic field measurements for a magnetometer bias induced at least in part by the vehicle, and determining vehicle position based at least in part on the compensated magnetic field magnetic measurements, the magnetic map information and the parameters of vehicle motion.

This disclosure also includes a device for determining vehicle position within an indoor environment, such that the device has at least one processor configured to obtain magnetic field measurements from the vehicle, obtain sensor information for the vehicle, obtain magnetic map information for the indoor environment, derive parameters of vehicle motion from the sensor information, process the magnetic field measurements to mitigate vehicular interference, compensate the processed magnetic field measurements for a magnetometer bias induced at least in part by the vehicle, and determine vehicle position based at least in part on the compensated magnetic field magnetic measurements, the magnetic map information and the parameters of vehicle motion.

Further, this disclosure also relates to a system for determining vehicle position within an indoor environment. The system includes a server providing magnetic map information for the indoor environment and at least one processor configured to obtain magnetic field measurements from the vehicle, obtain sensor information for the vehicle, obtain magnetic map information for the indoor environment, derive parameters of vehicle motion from the sensor information, process the magnetic field measurements to mitigate vehicular interference, compensate the processed magnetic field measurements for a magnetometer bias induced at least in part by the vehicle, and determine vehicle position based at least in part on the compensated magnetic field magnetic measurements, the magnetic map information and the parameters of vehicle motion.

DETAILED DESCRIPTION

Figure 1:
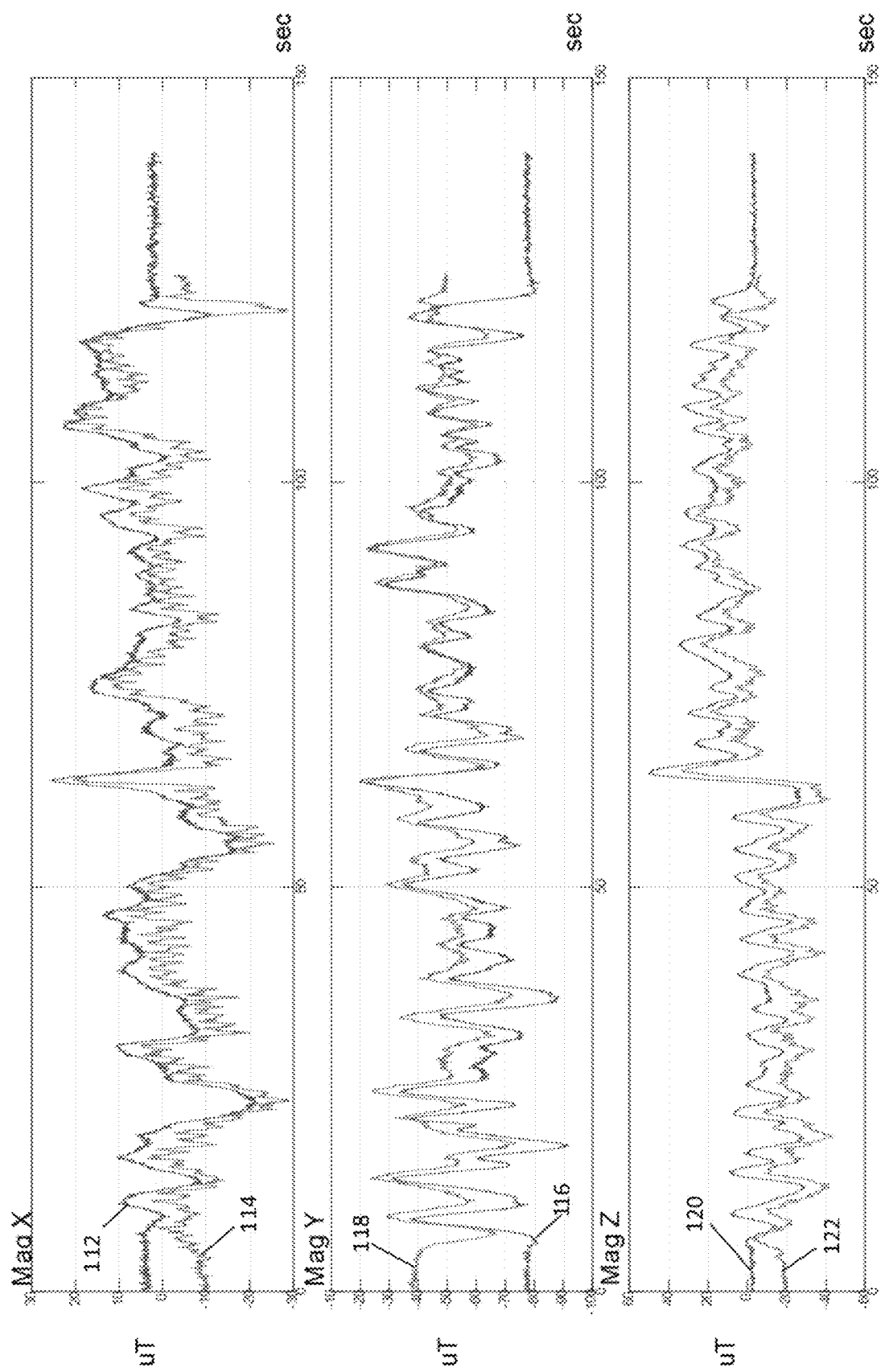
FIG. 1 is graphical representation comparing magnetic field measurements for a pedestrian and for a vehicle according to an embodiment.

At the outset, it is to be understood that this disclosure is not limited to particularly exemplified materials, architectures, routines, methods, or structures as such may vary. Thus, although a number of such options, similar or equivalent to those described herein, can be used in the practice or embodiments of this disclosure, the preferred materials and methods are described herein.

It is also to be understood that the terminology used herein is for the purpose of describing particular embodiments of this disclosure only and is not intended to be limiting. It is also to be understood that terms of art as used herein are to be given their accepted meanings known to one of ordinary skill in the art. Where appropriate, terms may also be given explicit definitions in the specification to convey their intended meaning.

For purposes of convenience and clarity only, directional terms, such as top, bottom, left, right, up, down, over, above, below, beneath, rear, back, and front, may be used with respect to the accompanying drawings or chip embodiments. These and similar directional terms should not be construed to limit the scope of the disclosure in any manner.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

Some portions of the detailed descriptions which follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing the terms such as "accessing," "receiving," "sending," "using," "selecting," "determining," "normalizing," "multiplying," "averaging," "monitoring," "comparing," "applying," "updating," "measuring," "deriving" or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments described herein may be discussed in the general context of processor-executable instructions residing on some form of non-transitory processor-readable medium, such as program modules, executed by one or more computers or other devices. Generally, program modules include routines, programs, objects, components, data structures, etc., that perform particular tasks or implement particular abstract data types. The functionality of the program modules may be combined or distributed as desired in various embodiments.

In the figures, a single block may be described as performing a function or functions; however, in actual practice, the function or functions performed by that block may be performed in a single component or across multiple components, and/or may be performed using hardware, using software, or using a combination of hardware and software. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure. Also, the exemplary wireless communications devices may include components other than those shown, including well-known components such as a processor, memory and the like.

The techniques described herein may be implemented in hardware, software, firmware, or any combination thereof, unless specifically described as being implemented in a specific manner. Any features described as modules or components may also be implemented together in an integrated logic device or separately as discrete but interoperable logic devices. If implemented in software, the techniques may be realized at least in part by a non-transitory processor-readable storage medium comprising instructions that, when executed, performs one or more of the methods described above. The non-transitory processor-readable data storage medium may form part of a computer program product, which may include packaging materials.

The non-transitory processor-readable storage medium may comprise random access memory (RAM) such as synchronous dynamic random access memory (SDRAM), read only memory (ROM), non-volatile random access memory (NVRAM), electrically erasable programmable read-only memory (EEPROM), FLASH memory, other known storage media, and the like. The techniques additionally, or alternatively, may be realized at least in part by a processor-readable communication medium that carries or communicates code in the form of instructions or data structures and that can be accessed, read, and/or executed by a computer or other processor. For example, a carrier wave may be employed to carry computer-readable electronic data such as those used in transmitting and receiving electronic mail or in accessing a network such as the Internet or a local area network (LAN). Of course, many modifications may be made to this configuration without departing from the scope or spirit of the claimed subject matter.

The various illustrative logical blocks, modules, circuits and instructions described in connection with the embodiments disclosed herein may be executed by one or more processors, such as one or more motion processing units (SPUs), digital signal processors (DSPs), general purpose microprocessors, application specific integrated circuits (ASICs), application specific instruction set processors (ASIPs), field programmable gate arrays (FPGAs), or other equivalent integrated or discrete logic circuitry. The term "processor," as used herein may refer to any of the foregoing structure or any other structure suitable for implementation of the techniques described herein. In addition, in some aspects, the functionality described herein may be provided within dedicated software modules or hardware modules configured as described herein. Also, the techniques could be fully implemented in one or more circuits or logic elements. A general purpose processor may be a microprocessor, but in the alternative, the processor may be any conventional processor, controller, microcontroller, or state machine. A processor may also be implemented as a combination of computing devices, e.g., a combination of an SPU and a microprocessor, a plurality of microprocessors, one or more microprocessors in conjunction with an SPU core, or any other such configuration.

Unless defined otherwise, all technical and scientific terms used herein have the same meaning as commonly understood by one having ordinary skill in the art to which the disclosure pertains.

Finally, as used in this specification and the appended claims, the singular forms "a, "an" and "the" include plural referents unless the content clearly dictates otherwise.

According to the techniques of this disclosure, systems and methods are provided for determining vehicle position within an indoor environment. As used herein, vehicle refers to any automated, robotic or piloted terrestrial, maritime or aerial vehicles, and other similar devices capable of motion, whether used for transporting one or more passengers or cargo, or any other suitable purpose. Conventional magnetic-based positioning techniques have been applied to applications involving pedestrians, but employing such techniques with vehicles is subject to additional complications as will be discussed in detail below. Nevertheless, an illustrative demonstration was performed to establish the suitability of the concept. As shown in FIG. 1, triaxial magnetometer measurements were obtained from a sensor mounted in a vehicle traversing an underground parking venue as well as from a sensor carried by a pedestrian who followed the vehicle along the same route at the same velocity. One graph is depicted for each axis of measurement, with the top view representing the x-axis measurements for the vehicle, trace 112, and the pedestrian, trace 114. Similarly, the middle view corresponds to the y-axis measurements, with trace 116 for the vehicle and trace 118 for the pedestrian, and the bottom view corresponds to the z-axis measurements, with trace 120 for the vehicle and trace 122 for the pedestrian. As can be seen, the traces track each other closely when aligned, demonstrating that both the pedestrian and the vehicle sensors measure the same ambient magnetic fields.

Figure 2:
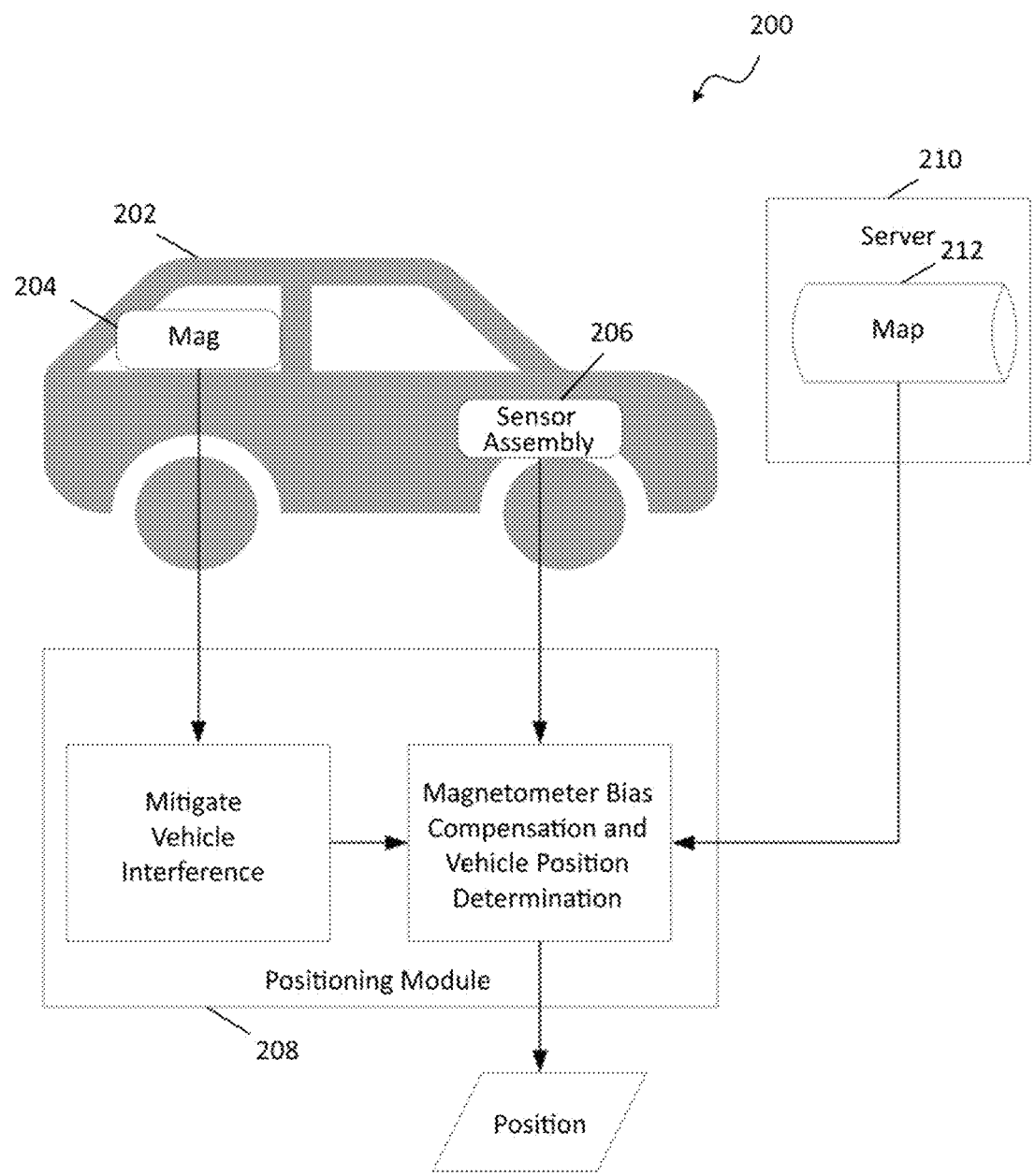
FIG. 2 is schematic diagram of a system for determining vehicle position within an indoor environment using magnetic field measurements according to an embodiment.

An exemplary system 200 for magnetic-based indoor vehicle positioning is depicted in FIG. 2 with high level schematic blocks. As shown, system 200 includes a vehicle 202 having a magnetometer 204 and at least one sensor assembly 206. A positioning module 208 is also provided, incorporating at least one processor, which may be one or more microprocessors, central processing units (CPUs), or other processors to run software programs stored in a suitable memory. Further, a server 210 may be used to maintain a magnetic fingerprint map 212 encompassing the indoor environment in which vehicle 202 is operating. As indicated, positioning module 208 is configured to mitigate vehicular interference in the magnetometer measurements. Many components of a vehicle like an engine, wires, etc. create electromagnetic fields (EMF), which can change significantly when the engine starts, when the vehicle accelerates or deaccelerates and in other situations. To provide positioning, a magnetometer installed on/in the vehicle senses the ambient magnetic field and EMF created by the vehicle can interfere with ambient magnetic field measurements. Positioning module 208 is configured to mitigate this vehicular interference, for example by using the techniques described below. Further, positioning module 208 is also configured to compensate for magnetometer bias. As noted above, magnetometer measurements are subject to hard- and soft-iron distortions induced by an environment platform, especially by a vehicle to which the magnetometer is mounted. Calibration of a magnetometer is used to compensate for these distortions and to achieve desired accuracy of measurement of the ambient geomagnetic field. Conventionally, calibration and positioning are provided separately, such as by imparting a prescribed motion to the magnetometer in the vehicle environment and using known bias estimation algorithms. Subsequently, the bias is compensated in the magnetic field measurements and position is determined using calibrated measurements. The drawback to this conventional approach when determining vehicle position is that magnetometer bias can change, for example after the vehicle has been loaded by some ferromagnetic load, requiring recalibration for each change. Conversely, as described in further detail below, positioning module 208 simultaneously calibrates the magnetometer so that position determination can be performed without the need for magnetometer recalibration during vehicle operation.

Multiple layers of software can be provided in the memory, which may be any combination of computer readable medium such as electronic memory or other storage medium such as hard disk, optical disk, etc., for use by the processor(s). For example, an operating system layer can be provided to control and manage system resources in real time, enable functions of application software and other layers, and interface application programs with other software and functions. Similarly, different software application programs such as navigation software, communications software, such as telephony or wireless local area network (WLAN) software, or any of a wide variety of other software and functional interfaces can be provided. In some embodiments, multiple different applications can be provided, and in some of those embodiments, multiple applications can run simultaneously. Positioning module 208 may be implemented in vehicle 202, in server 210, in other remote processing resources, or in any desired distribution among the processors of system 200. For example, some functionality can be performed in vehicle 202 and other functionality performed in server 210 if warranted by the chosen architecture. In some embodiments, one or more motion algorithm layers may provide motion algorithms for lower-level processing of raw sensor data provided from internal or external sensors. Further, a sensor device driver layer may provide a software interface to the hardware sensors of sensor assembly 206 and/or magnetometer 204. Some or all of these layers can be provided in memory for access by the processing resources of system 200. Again, embodiments of this disclosure may feature any desired division of processing as appropriate for the applications and/or hardware being employed. Aspects implemented in software may include but are not limited to, application software, firmware, resident software, microcode, etc., and may take the form of a computer program product accessible from a computer-usable or computer-readable medium providing program code for use by or in connection with a computer or any instruction execution system.

Sensor assembly 206 may be one or more sensor assemblies for providing motion sensor data representing motion in space, including inertial sensors such as an accelerometer and a gyroscope and may be termed an inertial measurement unit (IMU), other motion sensors including a pressure sensor or others may be used in addition. Depending on the configuration, sensor assembly 206 measures one or more axes of rotation and/or one or more axes of acceleration of the device. In one embodiment, sensor assembly 206 may include inertial rotational motion sensors or inertial linear motion sensors. For example, the rotational motion sensors may be gyroscopes to measure angular velocity along one or more orthogonal axes and the linear motion sensors may be accelerometers to measure linear acceleration along one or more orthogonal axes. In one aspect, three gyroscopes and three accelerometers may be employed, such that a sensor fusion operation by processing resources of system 200 combines data from sensor assembly 206 to provide a six axis determination of motion or six degrees of freedom (6DOF). As desired, sensor assembly 206 may be implemented using Micro Electro Mechanical System (MEMS), allowing integration into a single small package, but the techniques of this disclosure may be applied to any sensor design or implementation. Exemplary details regarding suitable configurations sensor assembly 206 may be found in commonly owned U.S. Pat. Nos. 8,250,921 and 8,952,832, which are hereby incorporated by reference in their entirety and implementations are available from InvenSense, Inc. of Sunnyvale, Calif.

As noted, vehicle 202 also includes magnetometer 204, such as a three axis magnetometer, to obtain measurements of the ambient magnetic field surrounding the vehicle. Magnetometer 204 may be external, i.e., not integrated with sensor assembly 206, or may be internal, i.e., integrated with, sensor assembly 206. In addition to using the magnetic measurements for matching a fingerprint map provided by server 210, the data may also be fused with the gyroscope and accelerometer inertial sensor data to provide a nine axis determination of motion. Likewise, when sensor assembly 206 has access to pressure sensor information, an altitude determination may be provided to be fused with the other sensor data to provide a ten axis determination of motion. Further, sensor assembly 206 may provide information about the speed of vehicle 202, such as from an odometer/speedometer, a suitable onboard diagnostic interface (e.g., OBD-2 or CAN bus), or other velocity sensor (e.g., Doppler).

The components of processing module 208, server 210 and other components of system 200 may be coupled through a bus, which may be any one or combination of suitable buses or interfaces, such as a peripheral component interconnect express (PCIe) bus, a universal serial bus (USB), a universal asynchronous receiver/transmitter (UART) serial bus, a suitable advanced microcontroller bus architecture (AMBA) interface, an Inter-Integrated Circuit (I2C) bus, a serial digital input output (SDIO) bus, a serial peripheral interface (SPI) or other equivalent. Further, communications between any components of system 200 may also be implemented wirelessly, such as through a Wireless Local Area Network (WLAN) conforming to Institute for Electrical and Electronic Engineers (IEEE) 802.11 protocols, or other systems including cellular-based and WLAN technologies such as Universal Terrestrial Radio Access (UTRA), Code Division Multiple Access (CDMA) networks, Global System for Mobile Communications (GSM), IEEE 802.16 (WiMAX), Long Term Evolution (LTE), other transmission control protocol, internet protocol (TCP/IP) packet-based communications, or the like may be used. In some embodiments, multiple communication systems may be employed to leverage different capabilities. Typically, communications involving higher bandwidths may be associated with greater power consumption, such that other channels may utilize a lower power communication protocol such as BLUETOOTH®, ZigBee®, ANT or the like. Generally, communication may be direct or indirect, such as through one or multiple interconnected networks. As will be appreciated, a variety of systems, components, and network configurations, topologies, and infrastructures, such as client/server, peer-to-peer, or hybrid architectures, may be employed to support distributed computing environments. For example, computing systems can be connected together by wired or wireless systems, by local networks or widely distributed networks. Currently, many networks are coupled to the Internet, which provides an infrastructure for widely distributed computing and encompasses many different networks, though any network infrastructure can be used for exemplary communications made incident to the techniques as described in various embodiments. For the sake of illustration only and without limitation, a suitable wireless communication link may be used by processing module 208 to obtain the magnetic fingerprint map information 212 from server 210. Similarly, depending on where processing module 208 is implemented, wireless communication may be used to receive measurements from the vehicle magnetometer 204 and/or sensor information from sensor assembly 206.

Figure 3:
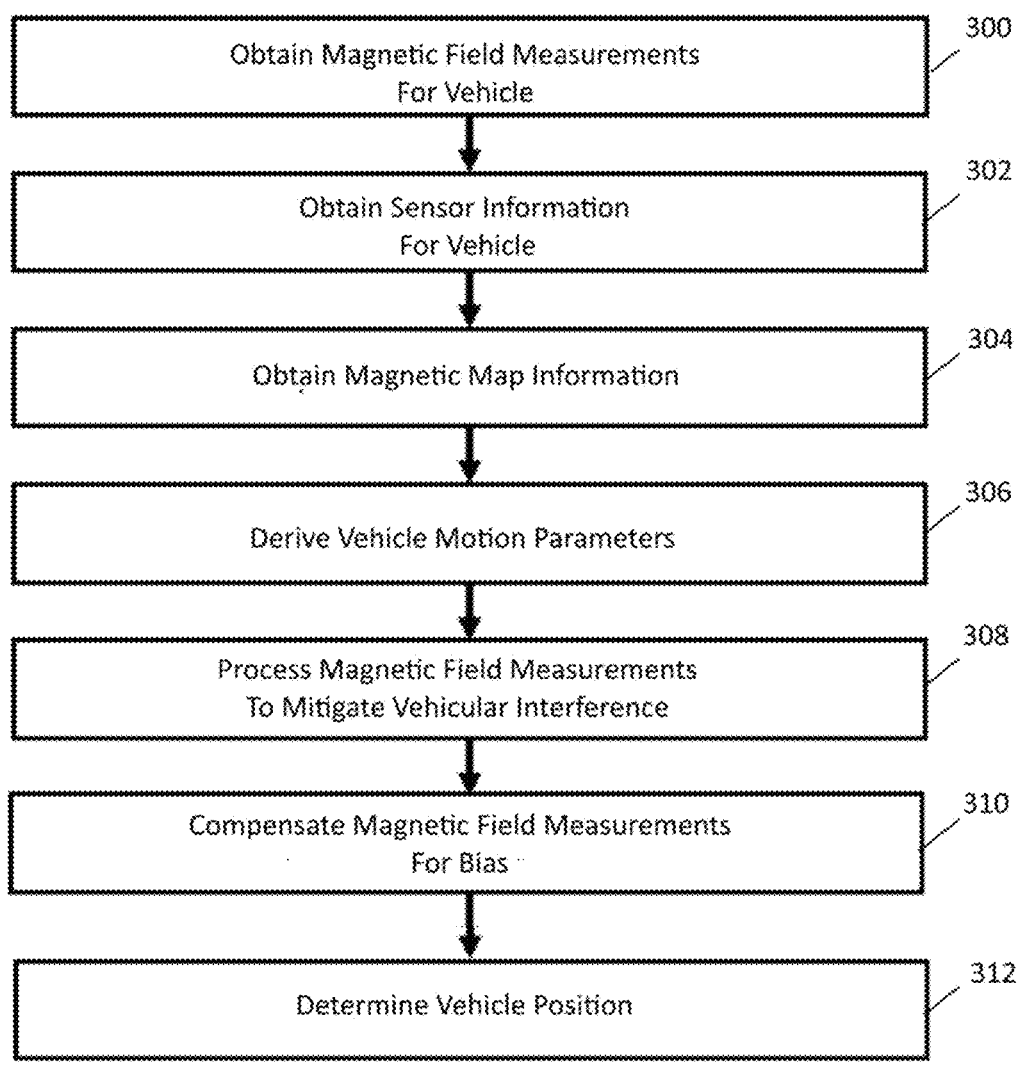
FIG. 3 is a flowchart of a routine for determining vehicle position within an indoor environment using magnetic field measurements according to an embodiment.

As will be discussed in detail below, the techniques of this disclosure involve determining position for vehicle 202. Depending on the embodiment, the position may be determined alone or as part of a navigation solution that also includes velocity and/or attitude. To help illustrate these aspects, FIG. 3 depicts an exemplary routine for magnetic-based indoor vehicle positioning. Beginning with 300, magnetic field measurements are obtained from the vehicle, such as from magnetometer 204. In 302, sensor information is obtained for the vehicle, such as from sensor assembly 206. Magnetic map information 212 is obtained in 304 from server 210 for the indoor environment in which vehicle 202 is operating. In 306, parameters of vehicle motion are derived using the sensor information. Then, in 308, the magnetic field measurements are processed to mitigate for vehicular interference and in 310, the processed magnetic field measurements are compensated for a magnetometer bias induced at least in part by the vehicle. Consequently, vehicle position is determined in 312 based at least in part on the compensated magnetic field magnetic measurements, the magnetic map information and the parameters of vehicle motion.

In one aspect, magnetometer height for the magnetic field measurements may be obtained so that the magnetic map information may be interpolated to derive magnetic field measurements for the indoor environment at the magnetometer height. Determining vehicle position may be further based on the interpolated magnetic map information.

In one aspect, processing the magnetic field measurements may involve detecting a period of time characterized by change in vehicle velocity, such that vehicle position is propagated during the period of time without the processed magnetic field measurement using the parameters of vehicle motion. Detecting the period of time may involve identifying at least one or a combination of: i) a change in the obtained magnetic field measurements that exceeds a threshold; ii) a change in the obtained sensor information, wherein the sensor information comprises accelerometer measurements; iii) a change in power usage of an engine of the vehicle; and iv) a change in operation of an engine of the vehicle.

In one aspect, processing the magnetic field measurements may involve at least one or a combination of: i) providing spatial separation between electromagnetic field sources of the vehicle and a magnetometer used to provide the magnetic field measurements; and ii) suppressing high-frequency components of the magnetic field measurements.

In one aspect, the parameters of vehicle motion may include at least velocity and change of heading. The sensor information used to derive the parameters of vehicle motion may be at least one or a combination of: i) an odometer; ii) an inertial motion sensor; iii) a velocity sensor; and iv) a pressure sensor.

In one aspect, a state estimation technique may be used to derive the vehicle position based at least in part on the compensated magnetic field measurements, the magnetic map information and the parameters of vehicle motion. The state estimation technique may simultaneously determine the magnetometer bias and the vehicle position. The state estimation technique may include a filter for estimating a linear state for the magnetic bias and a filter for estimating a non-linear state for the vehicle position. The state estimation technique may include a Kalman filter and a particle filter, such as being implemented with a Rao-Blackwellized particle filter.

In one aspect, an initial magnetometer bias may be determined during a previous session.

In one aspect, the magnetic-based vehicle positioning may be combined with at least one or a combination of: i) map-matching; ii) radio frequency fingerprinting; iii) proximity sensing; and iv) an optical technique.

As noted above, this disclosure also includes a device for determining vehicle position within an indoor environment comprising at least one processor. In one aspect, the at least one processor may be further configured to obtain magnetometer height for the magnetic field measurements and interpolate the magnetic map information to derive magnetic field measurements for the indoor environment at the magnetometer height so the vehicle position is determined further based on the interpolated magnetic map information.

In one aspect, the device may also include a magnetometer, wherein the magnetometer provides the obtained magnetic field measurements.

In one aspect, the device may also include at least one sensor assembly configured to provide at least some of the sensor information used to derive the parameters of vehicle motion.

Still further, this disclosure includes a system for determining vehicle position within an indoor environment having a server and at least one processor as discussed above. In one aspect, the server may be further configured to obtain magnetometer height for the magnetic field measurements and interpolate the magnetic map information to derive magnetic field measurements for the indoor environment at the magnetometer height so the vehicle position is determined further based on the interpolated magnetic map information.

In one aspect, the server may be further configured to provide information for a supplemental position determination with assistance from at least one or a combination of: i) map-matching; ii) radio frequency fingerprinting; iii) proximity sensing; and iv) optical technique; wherein the determined vehicle positioning is combined with the supplemental technologies.

EXAMPLES

The examples set forth below in connection with the appended drawings is intended as a description of exemplary embodiments of the present disclosure and is not intended to represent the only exemplary embodiments in which the present disclosure can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the specification. It will be apparent to those skilled in the art that the exemplary embodiments of the specification may be practiced without these specific details. In some instances, well known structures and devices are shown in block diagram form in order to avoid obscuring the novelty of the exemplary embodiments presented herein.

Figure 4:
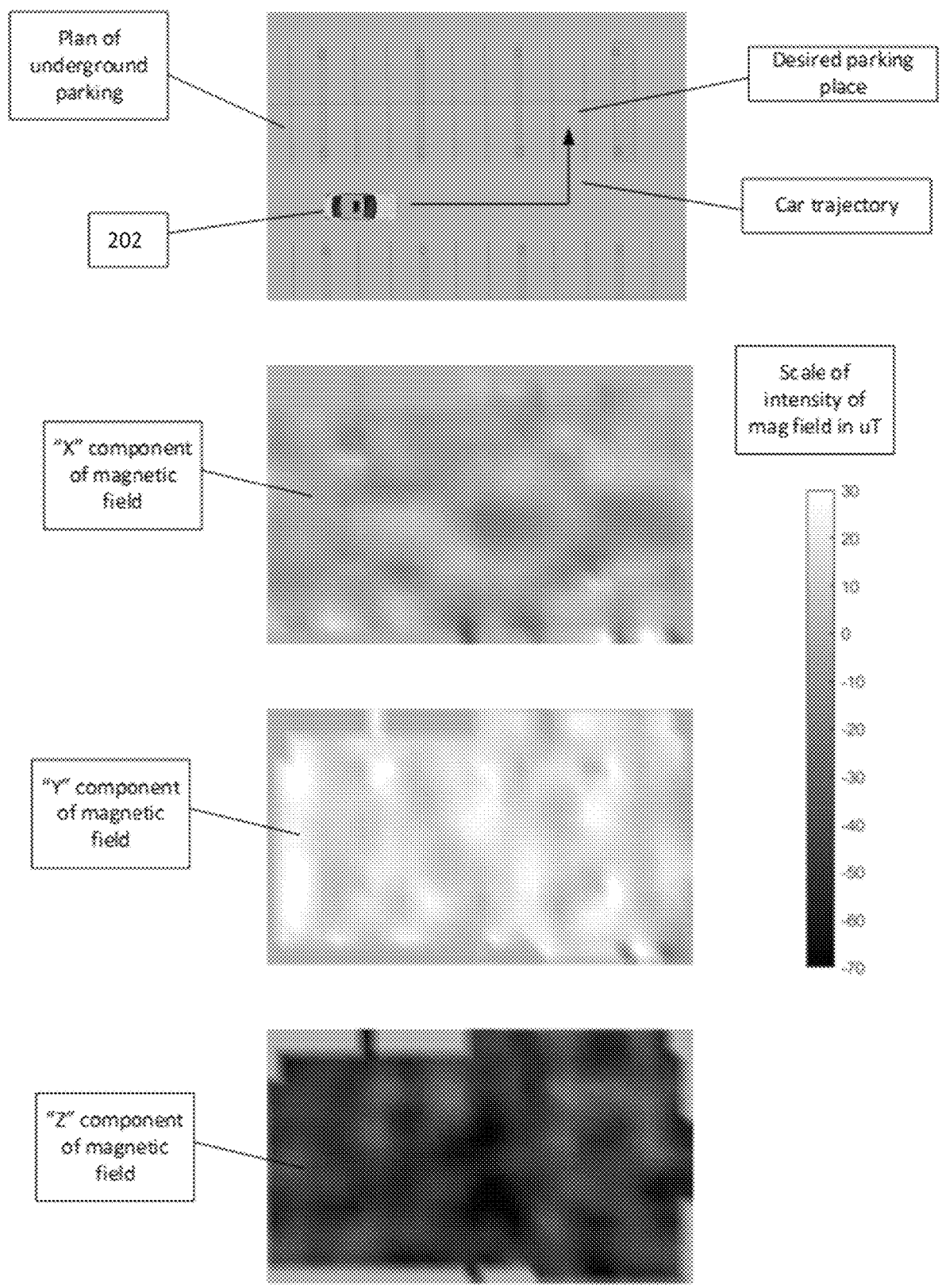
FIG. 4 is a graphical representation of the magnetic field for an indoor venue according to an embodiment.

As described above, the techniques of the disclosure involve determining position for a vehicle indoors using magnetic field measurements. To help illustrate, the top view of FIG. 4 schematically depicts a vehicle 202 undergoing a trajectory within an underground parking garage, while the remaining three views graphically depict the intensity of the magnetic field within the parking garage along the same coordinate axes x, y and z, respectively, as the parking garage plan. The magnetic field levels are displayed as shadows of gray color where intensity of gray relates to magnetic field level as indicated by the scale. This demonstrates that the magnetic field of the underground parking features sufficient variability to allow for positioning vehicle 202 by measuring magnetic field in an unknown location and determining position by comparison of that measurement with the magnetic field map built in known locations. Therefore, vehicle 202 can navigate to the desired parking place using the magnetic field measurements without using visual or other positioning methods.

Figure 5:
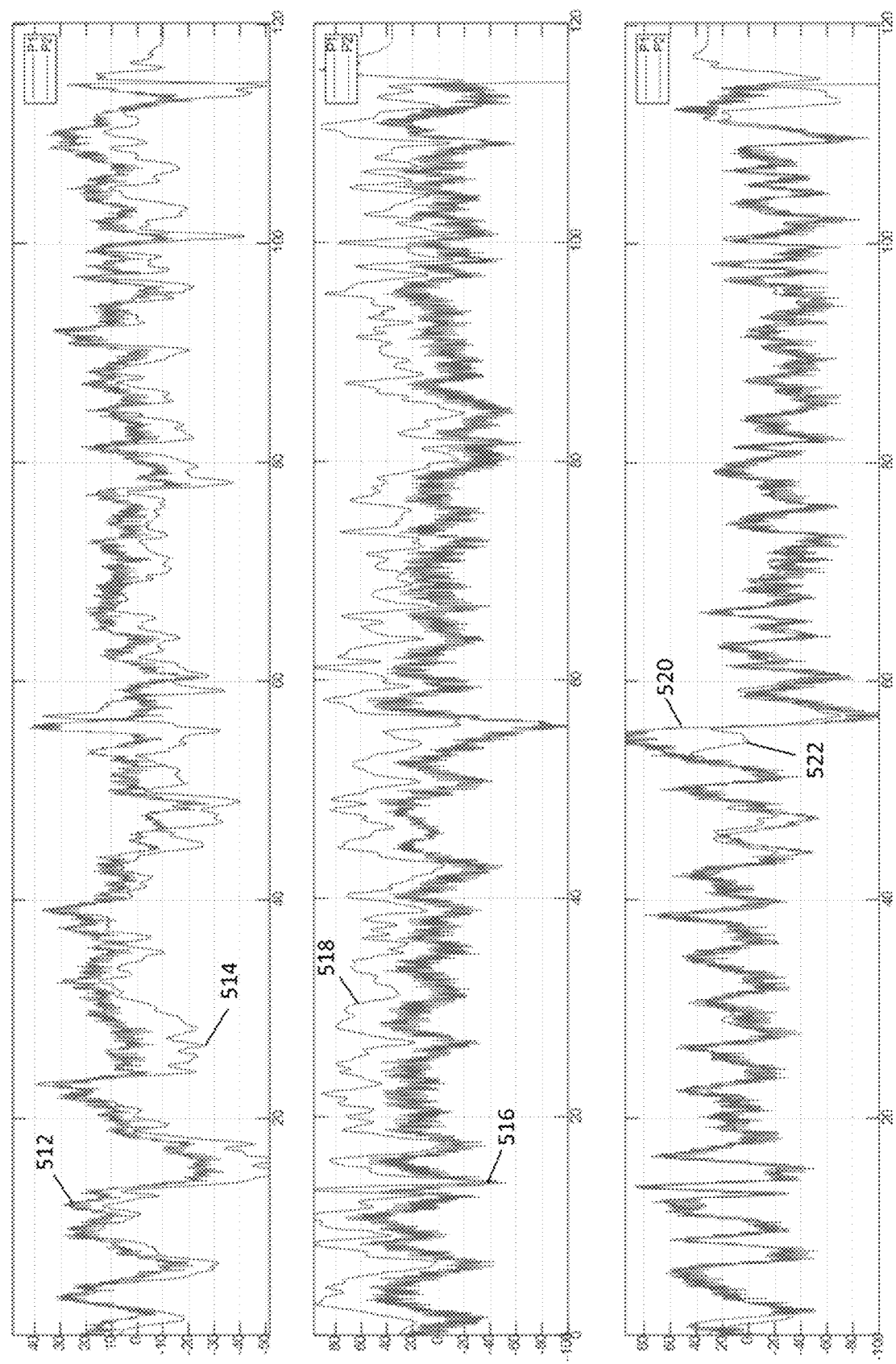
FIG. 5 is a graphical representation comparing magnetometer measurements recorded at relatively near and relative distant locations to a source of vehicular interference according to an embodiment.
Figure 6:
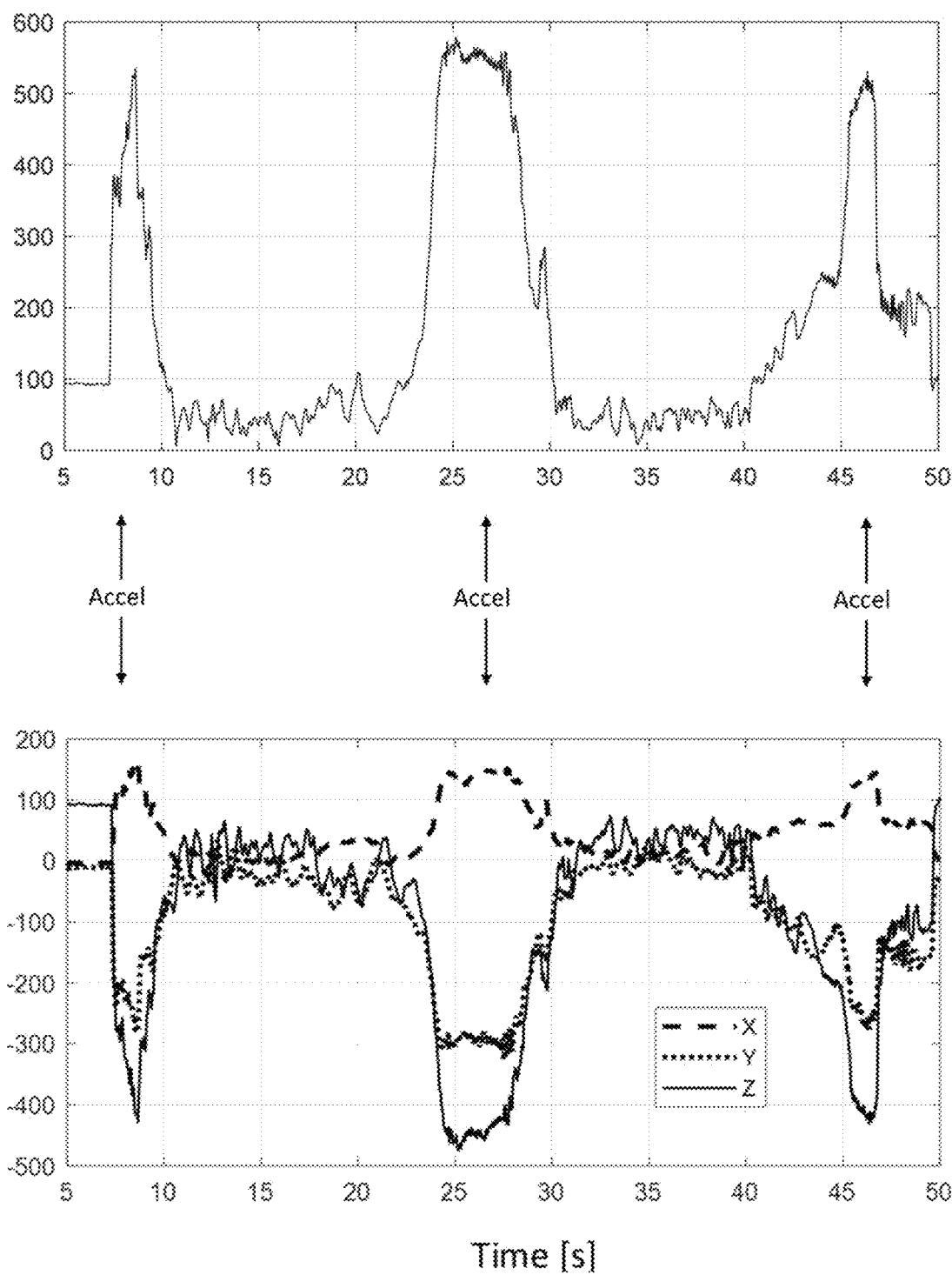
FIG. 6 is a graphical representation of magnetometer measurements recorded during period of acceleration according to an embodiment

As noted above, the vehicle in which the magnetometer is installed can create electromagnetic fields (EMF) that interfere with the magnetometer readings. The engine or motor of the vehicle is a primary source of vehicular interference, but other sources of EMF, e.g. electrical wires and other vehicle equipment, can also contribute. To help illustrate, FIG. 5 compares the magnetometer measurements obtained from sensors located relatively near and relatively distant from the engine when operated at a constant speed. The top view represents the x-component of the magnetic field, with trace 512 for the near sensor and trace 514 for the distant sensor. Similarly, the middle view represents the y-component, with trace 516 for the near sensor and trace 518 for the distant sensor and the bottom view represents the z-component, with trace 520 for the near sensor and trace 522 for the distant sensor. Although measurements of both magnetometers are relatively close to each other, measurements of the near magnetometer exhibit visible high-frequency noise whereas the far magnetometer is substantially free from the noise. As another illustration, FIG. 6 depicts the combined magnetometer magnitudes in the top view and the individual components in the bottom view for measurements obtained during intermittent periods of acceleration. In this example, the magnetometer was located relatively near the engine to emphasize the effect. During the indicated periods of accelerations, the impact on combined magnitude and on each component is clearly visible.

Mitigation of the vehicular interference with the magnetometer measurements can be achieved using any suitable techniques.

As a first example, spatial separation between the magnetometer and the EMF sources can be provided, based on the known physical laws that EMF attenuates with increasing of distance between a source of EMF and the measurement point. According to the Biot-Savart law, for example, the magnetic field induced by the direct current flowing through a wire is inversely proportional to the distance from the wire. The magnetic field is also proportional to the current, so distancing the magnetometer device from a source of EMF can protect the magnetometer measurements from interference of vehicle EMF as indicated by FIG. 5. When a more powerful source of EMF is present, such as in heavy vehicles, greater distance may be necessary, while a less powerful source of EMF, which is typical for small vehicles may require correspondingly less separation.

As a second example, high-frequency components of vehicle EMF can be suppressed in the magnetometer readings to eliminate or reduce the high-frequency noise that is visible in FIG. 5 for the near magnetometer. Any suitable digital or analog signal processing technique may be used to achieve the desired effect, such as by employing a low-pass filter.

As a third example, magnetometer readings corrupted by powerful EMF during acceleration or deacceleration can be rejected. This may involve detecting acceleration or deceleration, disabling magnetic-based positioning updates during the periods of acceleration or deceleration while utilizing motion sensor-based dead reckoning techniques to propagate position determinations and re-enabling magnetic-based position updates after the period of acceleration or deceleration has ended. Correspondingly, the use of corrupted magnetometer readings is avoided. As a practical matter, the periods of acceleration and deceleration of the vehicle indoors last for relatively short times during which propagation of position based on dead reckoning can occur without drift or other errors accumulating significantly. The periods of acceleration and deceleration can be identified in any suitable manner, including detection of significant change in the magnetometer readings such as those depicted in FIG. 6. Alternatively or in addition, vehicle acceleration and deceleration can be detected based on inertial sensor measurements, such as from sensor assembly 206. Further, vehicle acceleration and deceleration can be detected based on the change of power supply consumption, such as current, by the vehicle engine. Yet another technique for detecting vehicle acceleration and deceleration is based on change in an operating condition of the vehicle engine, such as revolutions per minute (RPM) or any other suitable metric. In each of these examples, appropriate thresholds can be used for the detection.

As discussed above, the techniques of this disclosure involve matching magnetometer readings from a vehicle to a magnetic fingerprint map of the venue in which the vehicle is operating, which provides the correlation between magnetic field measurements and positions. For example, a magnetic fingerprint map can be considered as a database every record of which can contain a 3D vector estimate of magnetic field at a certain position. Besides the 3D vector, the record can also contain other data, e.g. uncertainty of 3D magnetic estimate and possibly other parameters. Positions can be defined in a certain coordinate frame further named as a fingerprint frame, e.g. local coordinate frame of the venue, global coordinate frame or another appropriate frame. Thus, a fingerprint map comprises plurality of positions associated with parameters of magnetic field in said positions.

Creating magnetic fingerprint map involves collecting magnetometer readings from multiple positions inside a building separated by some distance and then estimating magnetic field in those positions by processing magnetometer readings. Another approach is crowdsourcing-based collection of the data. Although outside the scope of this disclosure, further details regarding these aspects may be found in co-pending, commonly-owned U.S. Patent Publication 2020/0103477, which is hereby incorporated by reference in its entirety.

Another aspect of the techniques of this disclosure is using the obtained sensor information for the vehicle to derive parameters of vehicle motion for propagating the vehicle state. In a general case, the state of a rigid vehicle is described by its 3D Cartesian coordinates and 3 orientation angles (roll, pitch, and heading). Instead of the Cartesian frame, any other coordinate frame can be used, e.g. the global frame. For applications involving a ground vehicle, 2D position (at constant height) and heading can be sufficient because ground vehicles moving indoors typically will not experience significant changes in height and in most cases, roll and pitch can be neglected. For applications involving aerial vehicles, generally all 3 coordinates including height (or altitude) and all 3 orientation angles may be necessary, although if sufficient constraints exist (e.g., constant altitude), 2D position and 3 orientation angles may be employed. As noted above, the information used to derive vehicle motion parameters are obtained from sensor assembly 206, which can include any one or combination of odometry, e.g. wheel sensors, inertial sensors, e.g., accelerometers and gyroscopes, velocity sensors, e.g. Doppler sensor, and a pressure sensor (barometer). Depending on the embodiment, the information may be available from a vehicle interface, such as a CAN bus or OBD-2, or from a flight control module of a UAV that in many cases is equipped with inertial sensors and a barometer and can determine roll and pitch angles and provide information about altitude information.

In a first example provided in the context of a ground vehicle, a motion model may be expressed using Equations (1)-(3), in which $\theta$ is heading, x and y are planar coordinates, $\dot{\theta}$ is heading angular velocity, v is linear velocity of the vehicle, $\Delta t$ is the time interval between two consecutive timestamps, $\xi_t^\theta$, $\xi_t^x$, $\xi_t^y$ are noise components for the corresponding heading and position coordinates, which are normal random variables with zero mean values and dispersions of $\sigma_\theta^2$, $\sigma_x^2$, $\sigma_y^2$ respectively:

$$\theta_t = \theta_{t-1} + \dot{\theta}_t \cdot \Delta t + \xi_t^\theta \quad (1)$$

$$x_t = x_{t-1} + v_t \cdot \Delta t \cdot \cos(\theta_t) + \xi_t^x \quad (2)$$

$$y_t = y_{t-1} + v_t \cdot \Delta t \cdot \sin(\theta_t) + \xi_t^y \quad (3)$$

In this example, two parameters of vehicle motion are needed: linear velocity v and heading angular velocity $\dot{\theta}$. The former can be obtained from a wheel sensor, other velocity sensor or an IMU, whereas the latter can be obtained from a gyro with vertically oriented axis.

In a second example provided in the context of an aerial vehicle, the motion model may be extended with height change according to Equation (4), in which h is height, $\Delta h$ is height change between two consecutive timestamps, $\xi_t^h$ is a noise component (normal random variable with zero mean value and dispersion $\sigma_h^2$):

$$h_t = h_{t-1} + \Delta h_t + \xi_t^h \quad (4)$$

Herein, in addition to linear velocity and heading angular velocity, the height change $\Delta h$ can be determined from barometer (pressure sensor) measurements. Further, roll $\sigma_t$ and pitch $\psi_t$ angles may also be needed to use in subsequent operations, as discussed below.

These examples and the associated Equations (1)-(4) represent embodiments in which vehicle state is propagated using a minimum number of vehicle motion parameters: 2 two parameters (linear velocity and heading angular velocity) in case of a ground vehicle and three parameters (additionally change of height) for an aerial vehicle. In other embodiments, more motion parameters (for example, information from all four-wheel sensors of ground vehicle wheels) can be obtained, allowing for the development of more complicated motion models.

The next step is to compensate the magnetometer bias using a suitable state estimation technique. A state estimation technique, such as a filter, includes a prediction phase and an update phase (which may also be termed a measurement update phase). A state estimation technique also uses a system model and measurement model(s) based on what measurements are used. The system model is used in the prediction phase, and the measurement model(s) is/are used in the update phase. The system model may be a total-state system model, in most cases total-state system models are nonlinear. In the total-state approach, the state estimation or filtering technique is estimating the state of the device itself (such as position, velocity, and attitude of the device), the system model or the state transition model used is the motion model itself, which in case of inertial navigation is a nonlinear model, this model is a total-state model since the estimated state is the state of the navigation device itself. In the error-state approach, the motion model is used externally in what is called inertial mechanization, which is a nonlinear model as mentioned earlier, the output of this model is the navigation states of the module, such as position, velocity, and attitude. The state estimation or filtering technique estimates the errors in the navigation states obtained by the mechanization, so the estimated state vector by this state estimation or filtering technique is for the error states, and the system model is an error-state system model which transitions the previous error-state to the current error-state. The mechanization output is corrected for these estimated errors to provide the corrected navigation states, such as corrected position, velocity and/or attitude. The estimated error-state is about a nominal value which is the mechanization output, the mechanization can operate either unaided in an open loop mode, or can receive feedback from the corrected states, this case is called closed-loop mode.

Further, as noted above, the techniques of this disclosure allow the compensation of bias to be performed simultaneously with the determination of vehicle position. Advantageously, the simultaneous magnetometer calibration and position determination does not require magnetometer manual recalibration even if the magnetometer bias has changed, for example, after the vehicle has been loaded by some ferromagnetic load. The following discussion is provided in the context of using a Rao-Blackwellized (AKA marginalized) particle filter (RBPF), but any equivalent state estimation technique may be used as desired.

Figure 7:
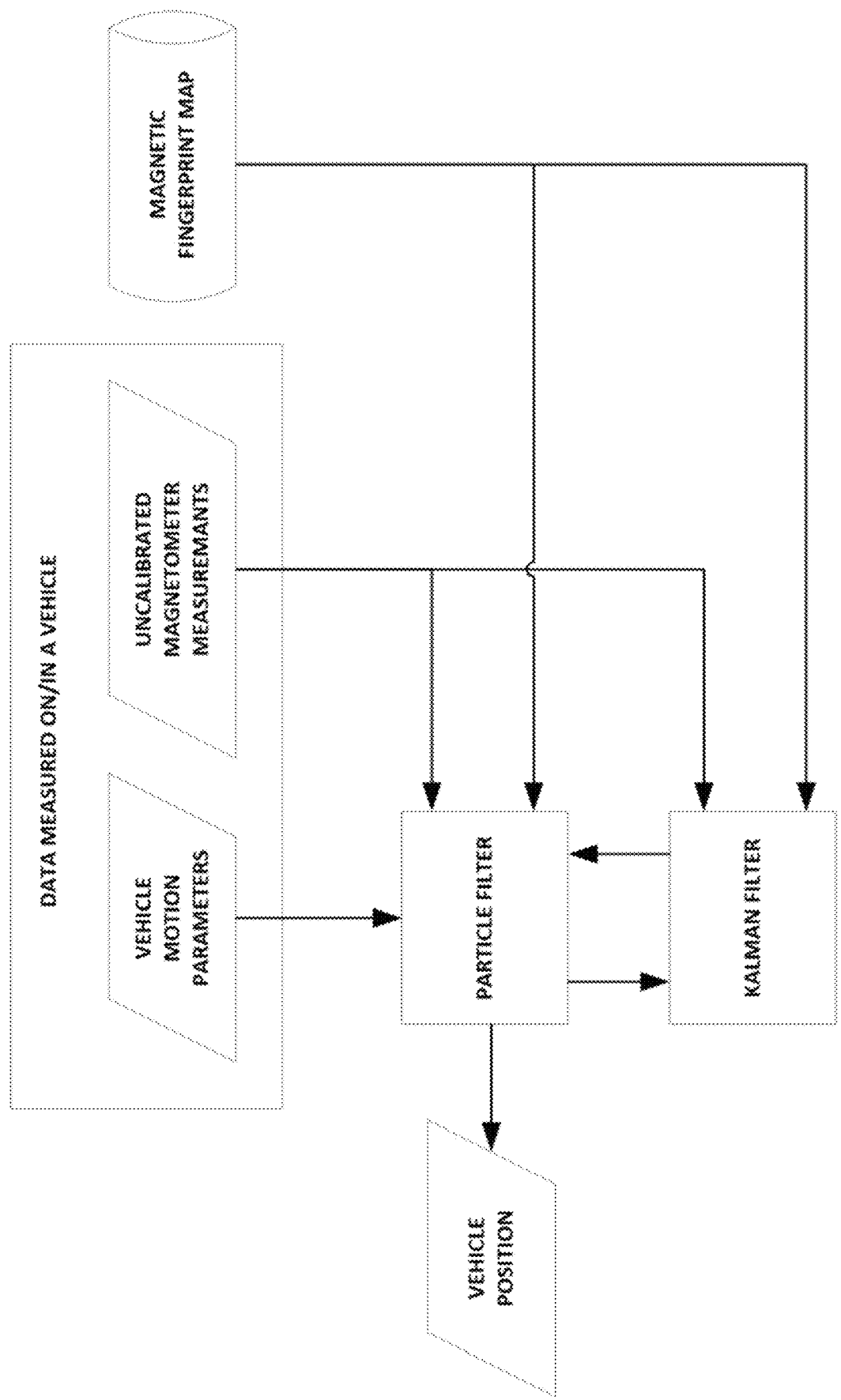
FIG. 7 is a schematic representation of a state estimation technique used for determining vehicle position within an indoor environment using magnetic field measurements according to an embodiment.

To help illustrate, FIG. 7 is a schematic block diagram of a suitable RBPF. As indicated, inputs to the RBPF include magnetometer measurements that have been processed as described above to mitigate for vehicular EMF interference, the magnetic fingerprint map, and the derived vehicle motion parameters. As known in the art, an RBPF is characterized by a state vector that is divided into two parts: a non-linear state and a linear state, with both the motion and measurement models linear in the linear state. The first, non-linear state is estimated by the particle filter (PF) and the second, linear state is estimated by the Kalman filter (KF). Both filters exchange the estimated states as indicated for use in the update stages of the filters. This approach allows a reduction of dimensions in the more computationally intensive non-linear part, i.e. in PF.

Here, the linear state is a 3D magnetometer bias vector $\vec{b}$ because the bias linearly depends on magnetometer readings and the magnetic fingerprint map. As for the non-linear state of a ground vehicle, it can comprise 2D position $x_t$, $y_t$ and a heading $\theta_t$, whereas for an aerial vehicle, the non-linear state additionally comprises an altitude (or a height) $h_t$. In the ground vehicle context, the motion model for non-linear state is given by equations (1)-(3) as detailed above. For the linear state, it may be considered that the magnetometer bias does not vary, allowing the measurement model to be expressed as Equation (5), in which $\vec{m}_t$ is 3D magnetometer measurement, R is 3×3 rotation matrix, which, in case of ground vehicle, depends only on heading $\theta_t$ and rotates around the vertical axis from the fingerprint frame into the body frame, M is 3D magnetic fingerprint map, $\vec{b}$ is 3D magnetometer bias, and $\vec{\xi}_t^m$ is magnetometer noise (3D vector) with zero mean and covariance $\sigma_m^2 I_3$:

$$\vec{m}_t = R(\theta_t)\vec{M}(x_t,y_t) + \vec{b} + \vec{\xi}_t^m \quad (5)$$

In this example, one suitable algorithm of RBPF for a ground vehicle is presented and the subsequent discussion will describe modifications for aerial vehicles. Each of N particles may be considered as a pair of Cartesian coordinates and heading of a vehicle $(x_t^i, y_t^i, \theta_t^i)$, i=1, ..., N, N is the number of particles and t is a time index. Each particle also contains a magnetometer bias $\vec{b}_t^i$ as a 3D vector. Each particle is assigned with a weight $w_t^i$, depending upon probability density value of this state.

This RBFP algorithm combines the prediction, update and resampling stages of PF and the prediction and update stages of KF. First, in the prediction stage, the non-linear particle state is propagated in the PF using vehicle motion parameters and a motion model. In a ground vehicle, Equations (1)-(3) can be employed, in which, for each particle i=1, ..., N, $v_t^i$ and $\dot{\theta}_t^i$ are drawn from normal distribution with respective means $v_t$ (vehicle velocity) and $\dot{\theta}_t$ (heading angular velocity) and respective dispersions $\sigma_{vt}^2$ and $\sigma_{\dot{\theta}t}^2$, where $\sigma_{vt}$ and $\sigma_{\dot{\theta}t}$ are corresponding uncertainties of velocity and heading change. As the magnetometer bias vector is almost constant, some small normal random 3D number can be added for every particle to cover a bias uncertainty. A covariance of the KF can be propagated using known equations for KF.

Next, in the update stage of the PF, particle weights $w_t^i$, i=1, ..., N, are updated using a likelihood function for the measurement model of Equation (5). The likelihood function in this example is the probability of observing the magnetometer measurement given the state of a particle. The probability can be evaluated using an appropriate 3D distribution, for example multivariate normal or Student distribution. The particle weights are also normalized so that their sum equals to one. Then, in the update stage of the KF, the linear state of the particles and the covariance are updated. The output vehicle position can be estimated as weighted average as indicated by Equations (6) and (7):

$$\bar{x}_t = \Sigma_{i=1}^N w_t^i x_t^i \quad (6)$$

$$\bar{y}_t = \Sigma_{i=1}^N w_t^i y_t^i \quad (7)$$

Particles can be resampled to prevent their weights from degradation. This stage can be executed from time to time based on the criteria known in the art.

As a further example, the above techniques can be applied to aerial vehicle applications with appropriate modifications. In particular, the motion model represented by Equations (1)-(3) is extended with the model for height, Equation (4) as discussed above. Correspondingly, the measurement model can be modified as indicated in Equation (8), where rotation matrix $R(\theta_t, \varphi_t, \psi_t)$, which transforms the magnetic fingerprint map into the body frame, depends not only on heading $\theta_t$, but also on roll $\varphi_t$ and pitch $\psi_t$ of the UAV and the magnetic fingerprint map $\vec{M}$ depends not only on 2D position $x_t$, $y_t$, but also on height $h_t$:

$$\vec{m}_t = R(\theta_t,\varphi_t,\psi_t)\vec{M}(x_t,y_t,h_t) + \vec{b} + \vec{\xi}_t^m \quad (8)$$

Notably, the particles also contain the height component $(x_t^i, y_t^i, \theta_t^i, h_t^i)$ i=1, ..., N, so that the output vehicle position also includes the altitude estimate as a weighted average according to Equation (9):

$$\bar{h}_t = \Sigma_{i=1}^N w_t^i h_t^i \quad (9)$$

In other aspects, the positioning algorithm can be the same as for the ground vehicle as discussed above.

Figure 8:
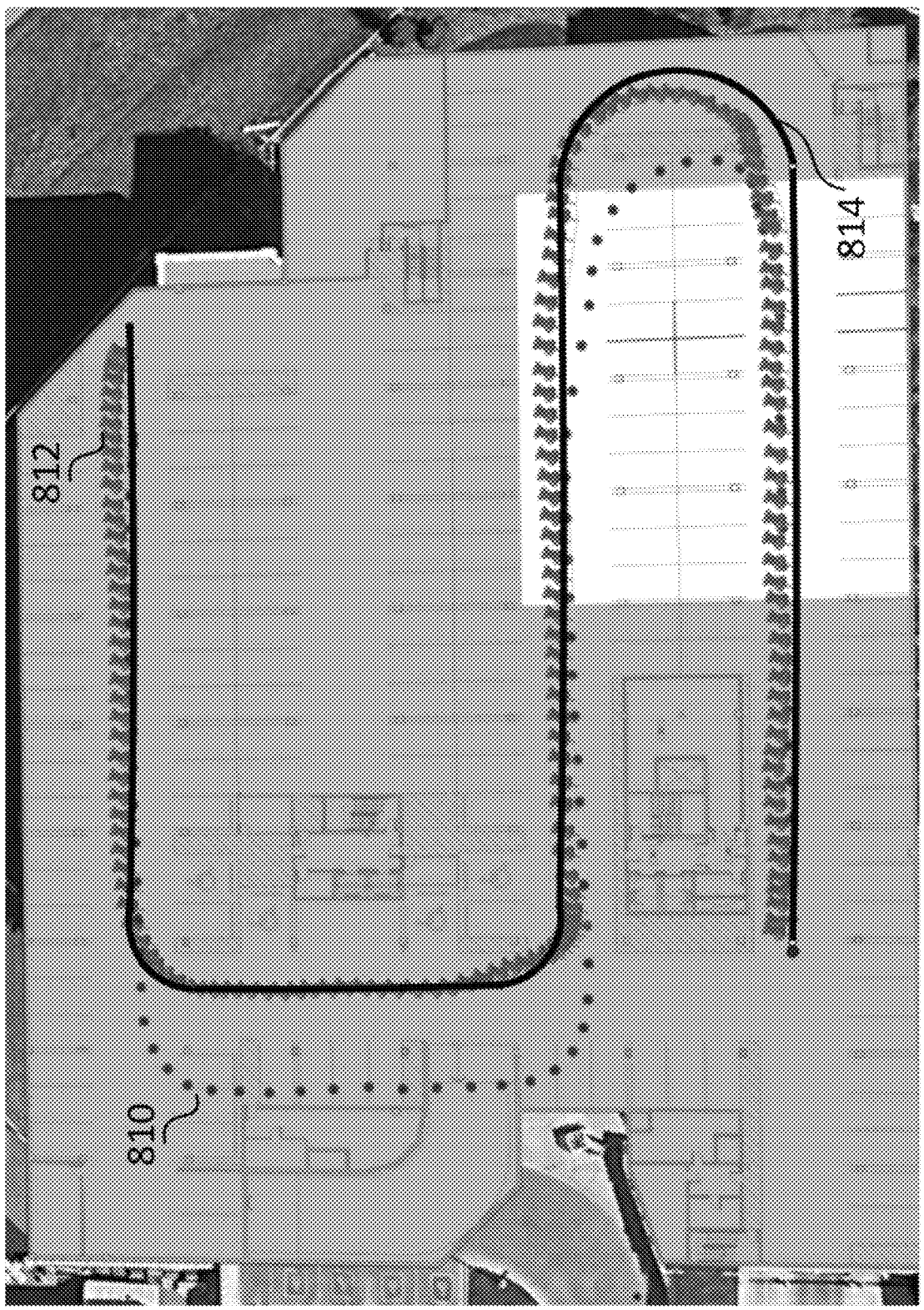
FIG. 8 is a graphical representation comparing position determinations made using vehicle motion parameters alone to positions determined using magnetic field measurements according to an embodiment.

As an illustration of the advantages represented by the techniques of this disclosure, a comparison was performed between the magnetic-based positioning discussed herein with conventional navigation using motion sensors alone. As schematically depicted in FIG. 8, a ground vehicle traversed an underground parking venue with the positions propagated using the vehicle motion parameters discussed above represented by dots 810 and the positions determined using the magnetic-based techniques of this disclosure represented by pins 812. The comparison with the reference path represented by the solid line 814 demonstrates that trajectory estimated using vehicle motion parameters alone suffered from various inaccuracies, including the determination that the ground vehicle crossed untraversable areas multiple time. Conversely, the magnetic-based position determinations correctly show the trajectory, for example by avoiding the untraversable areas.

From the above discussion, it will be appreciated that the ambient magnetic field is known to depend on height and not simply on 2D position. Accordingly, the magnetic fingerprint map desirably represents the magnetic field of the venue at the same height as the magnetometer used to obtain the magnetic field measurements for the vehicle. As such, this may depend on the location of the magnetometer in the vehicle as well as the height of the vehicle itself if capable of vertical motion, such as in a drone or UAV application. Thus, it is beneficial to employ magnetic fingerprint maps that have measurements at the appropriate height. For a ground vehicle or a constant altitude aerial vehicle, the magnetic fingerprint map should be at the height of magnetometer installation and operation and for an aerial vehicle with variable height of flight, the magnetic fingerprint map should cover the range of altitudes possible.

Usually, the magnetic fingerprint map is created as a result of survey of the venue. In one embodiment, the survey of the venue may be conducted by taking the magnetic measurements at the same height as the installation height of the magnetometer or equivalently the magnetometer may be installed at a height that matches the height at which the survey was conducted. Every position in magnetic fingerprint map is 3D, therefore generally the fingerprint map can be considered as a 3D grid. In most cases, it is very expensive to create the 3D fingerprint map of the whole venue and as a result, only a 2D magnetic fingerprint map is created at a fixed height of magnetic field measurements above the floor. In some cases, several layers of 2D fingerprint maps can be created, each layer featuring different height above the floor.

Thus, an additional optional aspect involves interpolating the magnetic map information to derive magnetic field measurements for the indoor environment at the magnetometer height. As will be appreciated, this allows providing a means for making a magnetic-based vehicle position determination in a greater range of circumstances. For example, vehicle construction limitations may not allow installation of the magnetometer at the specific height at which the survey was conducted. Additionally, by employing this approach, one survey may be used positioning with multiple vehicles having different magnetometer installation heights. Still further, these techniques may be employed when the vehicle changes altitude during operation.

One class of techniques for interpolating involves the use of any of the many general-purpose interpolation methods known in the art. For example, linear interpolation, cubic interpolation, Gaussian process regression, polynomial interpolation and others are all suitable. These methods can be used either in 1D variant for interpolation only with respect to a vertical coordinate or as 3D interpolation for interpolation between points of the 3D grid, e.g. tri-cubic interpolation.

Another class of techniques relies on Maxwellian interpolation of the magnetic field as detailed in the following discussion. The Maxwell equations for magnetostatics can be expressed as indicated in Equations (10) and (11), where B is a 3D vector magnetic field, J is the current density, $\mu_0$ is the permeability of free space and V is differential vector operator:

$$\nabla \cdot B = 0 \quad (10)$$

$$\nabla \times B = \mu_0 J \quad (11)$$

Given that typical indoor positioning venues are usually free spaces and most likely do not contain currents unless there are powerful electric cables in the positioning area, Equation (11) can be simplified as Equation (12):

$$\nabla \times B = 0 \quad (12)$$

Therefore, according to Equation (10), the magnetic field is divergence-free and according to Equation (12), the indoor magnetic field in most cases is curl-free. The Maxwell Equations (10) and (12) introduce additional constraints to the three components of magnetic field, reducing the parameters needed for interpolation. Correspondingly, a Maxwellian interpolation of magnetic field can be computationally more efficient and more accurate than general interpolation methods. Methods of Maxwellian interpolation of magnetic field based on either Equation (10) or both Equations (10) and (12) are known to those of skill in the art.

Figure 9:
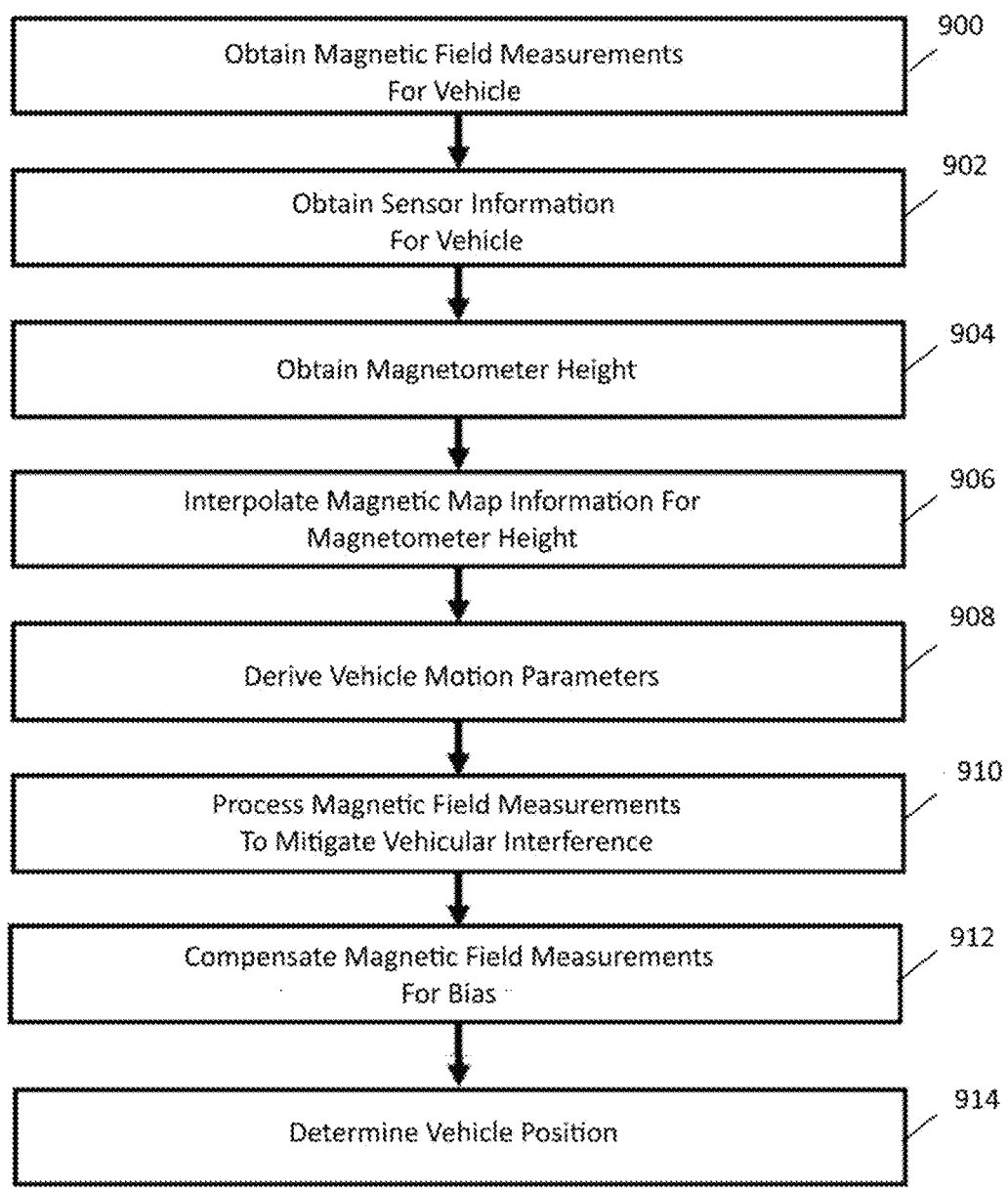
FIG. 9 is a flowchart of a routine for determining vehicle position within an indoor environment using interpolated magnetic field measurements according to an embodiment.

Accordingly, in some embodiments, the height dependence of the magnetic field is taken into consideration for magnetic-based vehicle positioning in indoor environments. As a further illustration of the techniques of this disclosure, FIG. 9 is another flowchart of a suitable routine for magnetic-based indoor positioning. Like FIG. 3, the routine begins at 900 with obtaining magnetic field measurements from the vehicle and sensor information is obtained for the vehicle in 902. In 904, the magnetometer height at which the magnetic field measurements are captured is determined. This may be a fixed value, reflecting the installation height, or it may be variable depending on operation of the vehicle and determined in any suitable manner, such as from the sensor information. Correspondingly, the magnetic map information is interpolated to calculate values for the determined magnetometer height in 906. Then, parameters of vehicle motion are derived using the sensor information in 908, the magnetic field measurements are processed to mitigate for vehicular interference in 910 and the processed magnetic field measurements are compensated for a magnetometer bias induced at least in part by the vehicle in 912. As a result, vehicle position is then determined in 914 based at least in part on the compensated magnetic field measurements, the interpolated magnetic map information and the parameters of vehicle motion.

Figure 10:
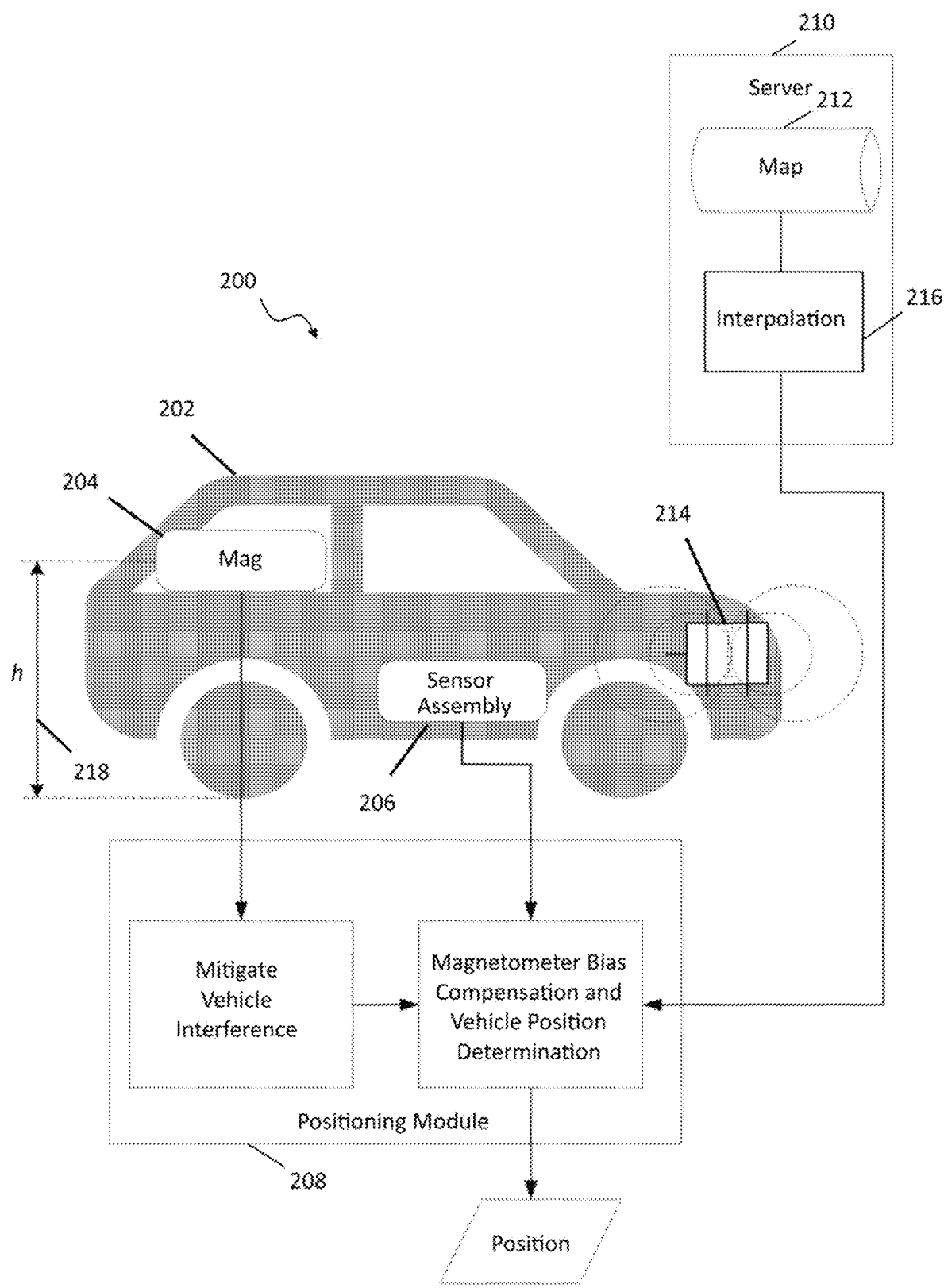
FIG. 10 is schematic diagram of a system for determining vehicle position within an indoor environment using magnetic field measurements interpolated by a server according to an embodiment.

Further, it will also be appreciated that a magnetic-based positioning system can accommodate different architectures regarding how the interpolation is performed. As a first illustrative example, a more detailed view of one embodiment of system 200 is schematically depicted in FIG. 10. The aspects that are in common with FIG. 2 are represented with the same reference numbers for vehicle 202, magnetometer 204, sensor assembly 206, processing module 208 and server 210. Additionally, vehicle 202 is shown with an engine 214, which is a source of vehicular EMF interference as indicated by the dashed circles, however, there can be other sources of EMF, e.g. electrical wires and other vehicle equipment. In this embodiment, the interpolation 216 of the magnetic field map information is performed at server 210. Server 210 receives a request from the processor of a vehicle to provide 2D magnetic fingerprint map at the specific height h 218 of magnetometer installation on/in ground vehicle 202. Upon the request, server 210 interpolates between available 2D layers, creating a 2D magnetic fingerprint map at the desired height and transmits the map to the processor through a suitable communication link as discussed above. The map can be downloaded to the memory of positioning module 208 as a whole or by parts (or tiles) to reduce traffic and storage requirements. This approach is suitable for ground vehicles with constant height of the magnetometer over the floor. Alternatively, server 210 can interpolate between the 2D layers of magnetic map to create a 3D magnetic map of the venue as a 3D grid. Similarly, processing module 208 loads the 3D map through a communication link and uses it for magnetic-based positioning. The map can be downloaded as a whole or by parts (or tiles) to reduce traffic and storage requirements. This approach is universal for both ground and aerial vehicles but more suitable for the latter.

Figure 11:
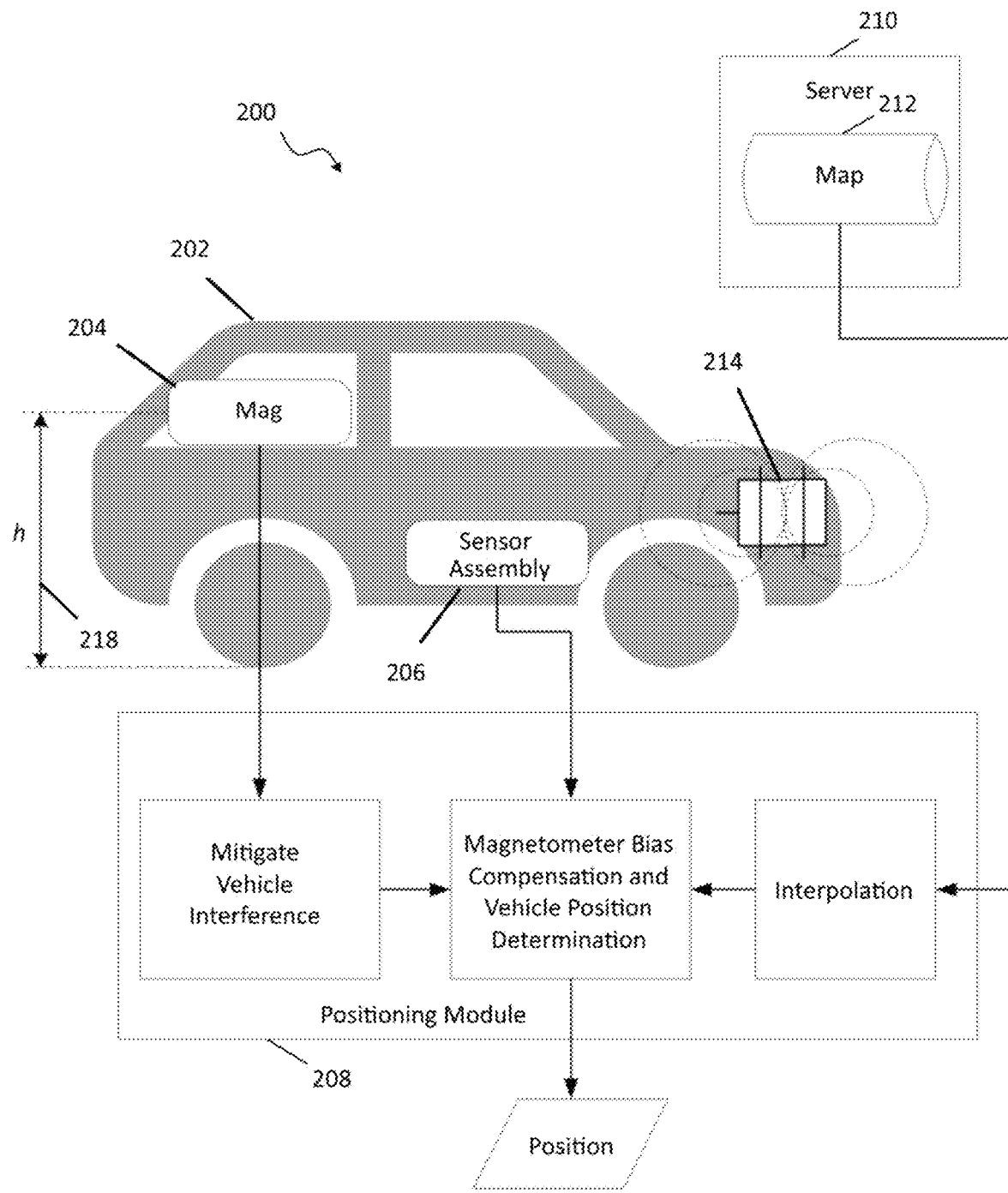
FIG. 11 is schematic diagram of a system for determining vehicle position within an indoor environment using magnetic field measurements interpolated by a positioning module according to an embodiment.

In other embodiments, the interpolation can be performed by processing module 208 as schematically indicated in FIG. 11. Here, positioning module 208 downloads from server 210 the available 2D magnetic maps through the communication link and allocates the maps in memory. Positioning module 208 then interpolates magnetic field between 2D layers and creates a magnetic fingerprint map at the desired height. Similar to the above, a 3D map more suitable for aerial vehicles may be created or a 2D map at desired height may be created for ground vehicles. Also similarly, processing module 208 can download the 2D magnetic map layers in whole or by parts (or tiles) and create a fragment of 3D map or 2D map at the desired height around the current position of the vehicle.

Contemplated Embodiments

The present disclosure describes the body frame to be x forward, y positive towards right side of the body and z axis positive downwards. It is contemplated that any body-frame definition can be used for the application of the method and apparatus described herein.

Magnetic-based indoor vehicle positioning can be combined with other positioning techniques depending upon availability for further improvement of positioning accuracy and reliability.

For example, the magnetic-based positioning techniques of this disclosure can be utilized with map matching. The purpose of the map matching algorithm is to refine a route of user by matching the route with the building floor plan. Assuming that a venue plan (e.g. a map of an underground parking garage) is available and is stored on the server, the venue plan defines obstacles that cannot be crossed by a vehicle like walls, structures and other untraversable areas, etc. Improvement of trajectory estimation is achieved by checking the permissibility of transition from one position to another one. A possible variant of using the floor venue involves obtaining map information from a server or other source for loading into positioning module 208. Combination of magnetic-based positioning and map matching can be realized based on a particle filter. Each particle of the PF is checked for the permissibility of transitioning from one position to another, using coordinates of the obstacles shown on the venue plan, for example walls. The result of checking is used in the PF during the update stage. If the transition of an i-th particle is not allowed, its weight is set to zero, i.e. $w_t^i=0$. Thus, map constraints prevent a position that results from crossing walls, visiting restricted zones.

Similarly, the magnetic-based positioning techniques of this disclosure can be utilized with other techniques. For example, the vehicle position determination can be further improved by combining the magnetic-based positioning and one or more of the following additional positioning technologies upon their availability. Illustrative possibilities, without exclusion, include (a non-exclusive list): radio frequency fingerprint-based positioning like Wi-Fi and Bluetooth® Low Energy (BLE) fingerprint-based positioning, proximity-based positioning with devices like radio frequency identification (RFID) tags and BLE beacons, optical-based positioning like camera-based and visible light communication (VLC)-based positioning. In such embodiments, the vehicle is equipped with means for using corresponding technologies, for example, a wireless module, a camera, etc. A possible variant of combining magnetic positioning with one or several of such technologies may involve obtaining from a server or other source the necessary supporting data like Wi-Fi or BLE fingerprint maps, location of proximity beacons and RFID tags, location of optical landmarks, etc. Processing module 208 then obtains measurements that are related to the additional positioning technologies. For example, in case of radio frequency fingerprint-based positioning, a set of Wi-Fi or BLE received signal strength indicator (RSSI) measurements from hearable Wi-Fi access points or BLE beacons at a current location of the vehicle. Next, a likelihood function based on measurements of the additional positioning method is computed. Due to the independence of measurements for different positioning methods, the likelihood can be considered as a product of likelihoods of measurements for these methods, for example, a product of the likelihood for magnetometer measurements with a likelihood for Wi-Fi RSSI measurements. Accordingly, particle weights in the update stage of the PF can be updated using the product of the likelihoods.

The embodiments and techniques described above may be implemented in software as various interconnected functional blocks or distinct software modules. This is not necessary, however, and there may be cases where these functional blocks or modules are equivalently aggregated into a single logic device, program, or operation with unclear boundaries. In any event, the functional blocks and software modules implementing the embodiments described above, or features of the interface can be implemented by themselves, or in combination with other operations in either hardware or software, either within the device entirely, or in conjunction with the device and other processer enabled devices in communication with the device, such as a server.

Although a few embodiments have been shown and described, it will be appreciated by those skilled in the art that various changes and modifications can be made to these embodiments without changing or departing from their scope, intent, or functionality. The terms and expressions used in the preceding specification have been used herein as terms of description and not of limitation, and there is no intention in the use of such terms and expressions of excluding equivalents of the features shown and described or portions thereof, it being recognized that the disclosure is defined and limited only by the claims that follow.

What is claimed is:

1. A method for determining vehicle position within an indoor environment, the method comprising:
    a) obtaining magnetic field measurements from a magnetometer associated with the vehicle;
    b) obtaining sensor information from a motion sensor associated with the vehicle;
    c) obtaining, from a server, magnetic map information for the indoor environment;
    d) deriving parameters of vehicle motion from the sensor information;
    e) processing the magnetic field measurements to mitigate electromagnetic vehicular interference created by electric equipment of the vehicle;
    f) compensating the processed magnetic field measurements for a magnetometer bias induced at least in part by the vehicle and its ferromagnetic load; and
    g) determining vehicle position based at least in part on the compensated magnetic field measurements, the magnetic map information and the parameters of vehicle motion.

2. The method of claim 1, further comprising obtaining magnetometer height for the magnetic field measurements and interpolating the magnetic map information to derive magnetic field measurements for the indoor environment at the magnetometer height so that determining vehicle position is further based on the interpolated magnetic map information.

3. The method of claim 1, wherein processing the magnetic field measurements comprises detecting a period of time characterized by change in vehicle velocity and wherein vehicle position is propagated during the period of time without the processed magnetic field measurement using the parameters of vehicle motion.

4. The method of claim 3, wherein detecting the period of time comprises identifying at least one or a combination of:

i) a change in the obtained magnetic field measurements that exceeds a threshold;
ii) a change in the obtained sensor information, wherein the sensor information comprises accelerometer measurements;
iii) a change in power usage of an engine of the vehicle; and
iv) a change in operation of an engine of the vehicle.

5. The method of claim 1, wherein processing the magnetic field measurements comprises at least one or a combination of:
i) providing spatial separation between electromagnetic field sources of the vehicle and a magnetometer used to provide the magnetic field measurements; and
ii) suppressing high-frequency components of the magnetic field measurements.

6. The method of claim 1, wherein the parameters of vehicle motion comprise at least velocity and change of heading.

7. The method of claim 6, wherein the sensor information used to derive the parameters of vehicle motion comprise at least one or a combination of:
i) an odometer;
ii) an inertial motion sensor;
iii) a velocity sensor; and
iv) a pressure sensor.

8. The method of claim 1, wherein a state estimation technique derives the vehicle position based at least in part on the compensated magnetic field measurements, the magnetic map information, and the parameters of vehicle motion.

9. The method of claim 8, wherein the state estimation technique simultaneously determines the magnetometer bias and the vehicle position.

10. The method of claim 9, wherein the state estimation technique comprises a filter for estimating a linear state for the magnetometer bias and a filter for estimating a non-linear state for the vehicle position.

11. The method of claim 10, wherein the state estimation technique comprises a Kalman filter and a particle filter.

12. The method of claim 11, wherein the state estimation technique is implemented with a Rao-Blackwellized particle filter.

13. The method of claim 1, wherein an initial magnetometer bias was determined during a previous session.

14. The method of claim 1, wherein the determined magnetic-based vehicle positioning is combined with at least one or a combination of:
i) map-matching;
ii) radio frequency fingerprinting;
ii) proximity sensing; and
iv) an optical technique.

15. A device for determining vehicle position within an indoor environment, comprising at least one processor configured to:
a) obtain magnetic field measurements from a magnetometer associated with the vehicle;
b) obtain sensor information from a motion sensor associated with the vehicle;
c) obtain, from a server, magnetic map information for the indoor environment;
d) derive parameters of vehicle motion from the sensor information;
e) process the magnetic field measurements to mitigate electromagnetic vehicular interference created by electric equipment of the vehicle;
f) compensate the processed magnetic field measurements for a magnetometer bias induced at least in part by the vehicle and its ferromagnetic load; and
g) determine vehicle position based at least in part on the compensated magnetic field measurements, the magnetic map information and the parameters of vehicle motion.

16. The device of claim 15, wherein the at least one processor is further configured to obtain magnetometer height for the magnetic field measurements and interpolate the magnetic map information to derive magnetic field measurements for the indoor environment at the magnetometer height so the vehicle position is determined further based on the interpolated magnetic map information.

17. The device of claim 15, wherein the device further comprises a magnetometer, wherein the magnetometer provides the obtained magnetic field measurements.

18. The device of claim 15, wherein the device further comprises at least one sensor assembly configured to provide at least some of the sensor information used to derive the parameters of vehicle motion.

19. A system for determining vehicle position within an indoor environment, comprising:
a) a server providing magnetic map information for the indoor environment; and
b) at least one processor configured to:
i) obtain magnetic field measurements from a magnetometer associated with the vehicle;
ii) obtain sensor information from a motion sensor associated with the vehicle;
iii) derive parameters of vehicle motion from the sensor information;
iv) process the magnetic field measurements to mitigate electromagnetic vehicular interference created by electric equipment of the vehicle;
v) compensate the processed magnetic field measurements for a magnetometer bias induced at least in part by the vehicle and its ferromagnetic load; and
vi) determine vehicle position based at least in part on the compensated magnetic field measurements, the magnetic map information and the parameters of vehicle motion.

20. The system of claim 19, wherein the server is further configured to obtain magnetometer height for the magnetic field measurements and interpolate the magnetic map information to derive magnetic field measurements for the indoor environment at the magnetometer height so the vehicle position is determined further based on the interpolated magnetic map information.

21. The system of claim 19, wherein the server is further configured to provide information for a supplemental position determination for at least one or a combination of techniques as follows:
i) map-matching;
ii) radio frequency fingerprinting;
iii) proximity sensing; and
iv) an optical technique;
wherein the determined vehicle magnetic-based positioning is combined with the supplemental techniques.

* * * * *